US005252773A

United States Patent [19]

Kozuki et al.

[11] Patent Number: 5,252,773

[45] Date of Patent: Oct. 12, 1993

[54] TONE SIGNAL GENERATING DEVICE FOR INTERPOLATING AND FILTERING STORED WAVEFORM DATA

[75] Inventors: Koichi Kozuki; Tetsuji Ichiki; Kazuhisa Okamura, all of Hamamatsu, Japan

[73] Assignee: Yamaha Corporation, Hamamatsu, Japan

[21] Appl. No.: 755,040

[22] Filed: Sep. 4, 1991

[30] Foreign Application Priority Data

Sep. 5, 1990 [JP] Japan .................................. 2-233104

[51] Int. Cl.[5] ........................ G10H 7/00; G11C zz/zz; H03M zz/zz

[52] U.S. Cl. ........................................ 84/607; 84/661; 84/DIG. 9

[58] Field of Search .................................. 84/600-603, 84/607, 608, 622, 623, 626, 630, 647, 661, 662, DIG. 9, DIG. 10, 604, 606

[56] References Cited

U.S. PATENT DOCUMENTS

| | | | |
|---|---|---|---|
| 4,437,379 | 3/1984 | Okumura . | |
| 4,719,833 | 1/1988 | Katoh et al. | 84/604 |
| 4,738,179 | 4/1988 | Hideo | 84/DIG. 9 X |
| 4,829,463 | 5/1989 | Kakishita et al. | 84/DIG. 9 X |
| 4,841,828 | 6/1989 | Suzuki | 84/DIG. 9 X |
| 4,907,484 | 3/1990 | Suzuki et al. | 84/661 |
| 4,953,437 | 9/1990 | Starkey | 84/606 X |
| 5,117,725 | 6/1992 | Takauji et al. | 84/605 |
| 5,140,886 | 8/1992 | Masaki et al. | 84/607 |
| 5,146,834 | 9/1992 | Izumisawa et al. | 84/607 |
| 5,157,623 | 10/1992 | Hayashi | 84/DIG. 9 X |

FOREIGN PATENT DOCUMENTS

| | | |
|---|---|---|
| 0273447 | 12/1987 | European Pat. Off. . |
| 145010 | 11/1989 | Taiwan . |

*Primary Examiner*—William M. Shoop, Jr.
*Assistant Examiner*—Jeffrey W. Donels
*Attorney, Agent, or Firm*—Graham & James

[57] ABSTRACT

There are provided a waveform generating section for generating waveform sample data at a frequency corresponding a designated pitch, a coefficient generating section for generating n coefficients that correspond to a desired interpolation characteristic, a characteristic-controlling section for changing the coefficients to be generated in the coefficient generating section so as to variably control the interpolation characteristic, and an interpolation operation section for operating the coefficients with n digital waveform sample data generated sequentially from the waveform generating section and synthesizing operated data to produce one sample data. With this arrangement, it becomes possible to control the interpolation characteristic and therefore a resultant filter characteristic in accordance with a desired mode, when generating a tone signal of a smooth waveform by waveform interpolation operation utilizing digital filter operation. For example, the interpolation characteristic can be controlled in accordance with a pitch or tone range so that a filter characteristic to be obtained as the result of the interpolation operation can be prevented from shifting as a pitch or tone range changes. Further, by controlling the interpolation characteristic in correspondence with a specific tone range, such characteristic can be established as to reliably eliminate an aliasing noise.

8 Claims, 6 Drawing Sheets

TONE SIGNAL GENERATING DEVICE FOR INTERPOLATING AND FILTERING STORED WAVEFORM DATA

BACKGROUND OF THE INVENTION

This invention relates to a tone signal generating device which generates a tone signal of a smooth waveform by waveform interpolation operation utilizing digital filter operation, and more particularly to controlling an interpolation characteristic in correspondence with a pitch of a tone to be generated.

Japanese Patent Laid-open Publication No. 63-168695, which corresponds to U.S. patent application Ser. No. 139, 659, proposes simplified filter operation realized by performing filter operation of m orders with respect to n tone signal sample data (where $n<m$). More specifically, it discloses that while tone signal sample data are sequentially generated in correspondence with an integer part of an address signal, n filter coefficients are selected from among filter coefficients of m orders in correspondence with the value of a decimal part of the address signal (combination of orders of filter coefficients to be selected differs depending on the decimal part of the address signal), and then the selected n filter coefficients are arithmetically operated with n tone signal data so that filter operation of m orders may be virtually performed.

Also, in this Japanese Patent Laid-open Publication No. 63-168695, it is disclosed that data stored at n addresses in a waveform memory, rather than data generated during fixed n sampling periods, are used as the n tone signal sample data. This means that rather than simple filter operation in accordance with constant sampling periods, filter operation is performed whose sampling period changes with a pitch of a tone to be generated, so as to effect waveform interpolation operation for n samples. As the result of such interpolation operation, one sample data is produced.

It is already known that, in the case where it is intended to eliminate an aliasing noise with a digital filter, what is required is to set the filter characteristic to be a low-pass filter characteristic and also to set the cut-off frequency at a frequency lower than a half of the sampling frequency fs. Thus, also in the case of the above-mentioned waveform interpolation operation, elimination of an aliasing noise can be effected by making the filter characteristic a low-pass filter characteristic and setting the cut-off frequency at a frequency lower than a half of the sampling frequency fs.

However, if a digital filter is utilized to perform waveform interpolation operation as shown in the Japanese Patent Laid-open Publication No. 63-168695, a virtual sampling period will change as a tone pitch changes, so that a resultant filter characteristic will also undesirably shift (without the coefficient values being changed) as a tone pitch changes. This is due to the fact that, in the case of waveform interpolation operation utilizing a digital filter, a unit delay time in the digital filter does not become constant, but it changes as a pitch changes. This causes inconveniences when it is desired not to shift the filter characteristic in correspondence with a pitch.

For example, when waveform interpolation and elimination of an aliasing noise are to be simultaneously performed, with the filter characteristic for use as an interpolation characteristic being made a low-pass filter characteristic, the cut-off frequency for the desired low-pass filter characteristic will change in correspondence with a pitch. Thus, the inconveniences that an aliasing noise can not be eliminated occurs if the pitch becomes higher and the cut-off frequency becomes higher than the frequency of the aliasing noise. The inconveniences may be forestalled if arrangements are made such that waveforms of sufficiently high resolution are produced in advance so as not to introduce such inconveniences at the maximum pitch of a tone to be generated. In that case, however, there will not be much use for performing waveform interpolation.

SUMMARY OF THE INVENTION

Therefore, it is an object of the present invention to provide a tone signal generating device which can control a filter characteristic by controlling an interpolation characteristic in correspondence with a pitch of a tone to be generated, when generating a tone signal of a smooth waveform by waveform interpolation operation utilizing digital filter operation.

More specifically, the present invention seeks to provide a tone generating device which can prevent a filter characteristic from shifting, by controlling an interpolation characteristic in correspondence with a pitch of a tone to be generated.

It is another object of the present invention to provide a tone signal generating device which can reliably eliminate an aliasing noise by controlling an interpolation characteristic in correspondence with a pitch of a tone to be generated, when generating a tone signal of a smooth waveform by waveform interpolation operation utilizing digital filter operation.

A tone signal generating device according to the present invention comprises a pitch designating section for designating a pitch of a tone to be generated, a waveform generating section for generating digital waveform sample data at a frequency corresponding to the pitch designated by the pitch designating section, a coefficient generating section for generating n coefficients that correspond to a desired interpolation characteristic, a characteristic-controlling section for changing coefficients to be generated in the coefficient generating section in correspondence with the pitch designated by the pitch designating section so as to variably control the interpolation characteristic, and an interpolation operation section for operating the coefficients with n digital waveform sample data generated sequentially from the waveform generating section and synthesizing operated data to produce one sample data.

The coefficient generating section generates n coefficients corresponding to a desired interpolation characteristic. The characteristic-controlling section changes coefficients to be generated in the coefficient generating section, so as to variably control the interpolation characteristic in correspondence with the pitch designated by the pitch designating section. In the interpolation operation section, interpolation operation is performed by operating the n coefficients respectively with n digital waveform data and synthesizing operation results or operated data to produce one sample data. The n coefficients corresponding to a desired interpolation characteristic also determines a corresponding filter characteristic; that is, the same n coefficients can be considered not only as interpolation coefficients for waveform interpolation but also as filter coefficients.

Conventionally, when performing waveform interpolation operation utilizing filter operation, the filter characteristic could not be controlled and undesirably moved in correspondence with a designated pitch. By contrast, according to the present invention, the n coefficients to be used for the interpolation operation are variably controlled and thus an interpolation characteristic can be controlled in correspondence with a designated pitch, with the result that it becomes possible to control a resultant filter characteristic.

This feature will now be illustrated.

It is assumed here that, as n coefficients corresponding to a desired interpolation characteristic, those corresponding to an impulse response characteristic as shown in part (a) of FIG. 1 are used. It is also assumed that n=7, and that the corresponding filter characteristic is a low-pass filter characteristic as shown in part (a) of FIG. 2. Further, for the sake of convenience, it is assumed that, at a predetermined designated pitch, a low-pass filter characteristic having a cut-off frequency fc as shown in part (a) of FIG. 2 is obtained. When the pitch becomes higher than the predetermined pitch, effective sampling intervals are caused to be narrower, so that the impulse response is virtually compressed in the time axis direction as shown in part (b) of FIG. 1. In response to this change, the resultant filter characteristic varies as shown in part (b) of FIG. 2, and the cut-off frequency fc1 becomes higher. Conversely, when the pitch becomes lower than the predetermined pitch, effective sampling intervals are caused to be broader, so that the impulse response is virtually expanded in the time axis direction as shown in part (d) of FIG. 1. In response to this change, the resultant filter characteristic varies as shown in part (d) of FIG. 2, and the cut-off frequency fc2 becomes lower. In FIG. 1, individual points along the horizontal axis correspond to coefficient orders, and sample intervals between waveform signal sample data corresponding to the respective coefficient orders are appreciably shown, with the horizontal axis being likened to the time axis.

Parts (b) and (d) of FIG. 1 illustrate an impulse response characteristic obtained by conventional techniques that do not perform the coefficient controls of the present invention. In this case, coefficient values corresponding to respective orders are not changed, so that a virtual impulse response is compressed or expanded directly following the change in waveform signal sample intervals.

By contrast, if coefficient values corresponding to respective orders are variably controlled so as to change an interpolation characteristic in accordance with the present invention, an impulse response can be changed from that as shown in part (b) or (d) to a desired one. For example, when it is desired to shift the cut-off frequency, what should be done is to change the values of the individual coefficients in such manner that the impulse response characteristic is compressed or expanded in the time axis direction. For example, when the pitch has become higher than the predetermined pitch, the values of the individual coefficients are changed in such manner that the impulse response characteristic is expanded in the time axis direction. In this way, the virtual impulse response can be changed from that as shown in part (b) of FIG. 1 to that as shown in part (c) of FIG. 1, and accordingly a resultant filter characteristic can be changed to that as shown in part (c) of FIG. 2 of which the cut-off frequency fc does not shift. When, on the other hand, the pitch has become lower than the predetermined pitch, the values of the individual coefficients are changed in correspondence with the difference between the pitches, in such a manner that the impulse response characteristic is compressed in the time axis direction. In this way, the virtual impulse response can be changed from that as shown in part (d) of FIG. 1 to that as shown in part (e) of FIG. 1, and accordingly the resultant filter characteristic can be changed to the one as shown in part (e) of FIG. 2 of which the cut-off frequency fc does not shift.

As mentioned, according to the present invention, n coefficients to be used for an interpolation operation are variably controlled in correspondence with a designated pitch, and thus the resultant filter characteristic can be prevented from shifting.

Any filter characteristic other than a low-pass filter characteristic can be used to achieve the purposes of the present invention.

In the case where a low-pass filter characteristic is used in an attempt to eliminate an aliasing noise, if, as shown in (b) of FIG. 2, the cut-off frequency fc1 moves higher, it is possible that the cut-off frequency fc1 becomes higher than a half of the sampling frequency so that an aliasing noise can not be eliminated any longer. On the other hand, if, as shown in (d) of FIG. 2, the cut-off frequency fc1 moves lower, an aliasing noise can still be eliminated. Therefore, when a pitch higher than the predetermined standard pitch has been designated in the case where it is intended to eliminate an aliasing noise, it is only sufficient to change the values of the individual coefficients in such manner that the impulse response characteristic is expanded in the time axis direction as shown in part (a) of FIG. 1. Here, it is to be understood that the predetermined standard pitch mentioned above means a pitch whose cut-off frequency for the low-pass filter characteristic to be obtained in response to a designated pitch is lower than a half of the sampling frequency, as shown in part (a) of FIG. 1.

In the case where it is not intended to eliminate an aliasing noise, rather than always performing a variable control of the coefficients in correspondence with each designated pitch, such variable control may be performed in correspondence only with a desired range of pitches so that a filter characteristic can be done only with respect to a specific tone range.

This invention can be applied not only to a normal-type interpolation operation in which coefficients of all the orders n are used directly as n coefficients but also to another-type interpolation operation in which a filter operation is carried out through simplified operation of n coefficients which are less in number than the total order number m. In the latter case, the waveform generating section may include a section for generating an address signal composed of an integer part and a decimal part that change at a rate corresponding to a designated pitch. The coefficient generating section may select and generate n coefficients in accordance with the above-mentioned address signal from among coefficient data of m orders ($n<m$) corresponding to a desired interpolation characteristic. In the later-described embodiments, the present invention will be described as being applied to waveform interpolation operation of the type in which operation of m orders is substantially carried out through simplified operation of n coefficients.

When the values of the individual coefficients are changed by the characteristic-controlling section in such manner that the impulse response characteristic is compressed or expanded in the time axis direction, it is possible that the marginal-order coefficients (that is, high-order coefficients) among finite order coefficients are caused to move halfway along the predetermined impulse response characteristic curve off zero-cross points. As the result, the continuousness of the impulse response characteristic can no longer be maintained, in which case, noise problem etc. can occur. So, in one mode of the present invention, some marginal-order coefficients may be discarded or cut out so as to maintain the continuousness of the impulse response characteristic. For example, such discard may be effected with zero-cross points along the impulse response characteristic curve being used as the discard border, because the discard at the zero-cross points do not damage the continuousness of the impulse response characteristic.

Now, embodiments of the present invention will be described with reference to the accompanying drawings.

DETAILED DESCRIPTION OF THE PREFERRED EMBODIMENTS

Figure 1A:
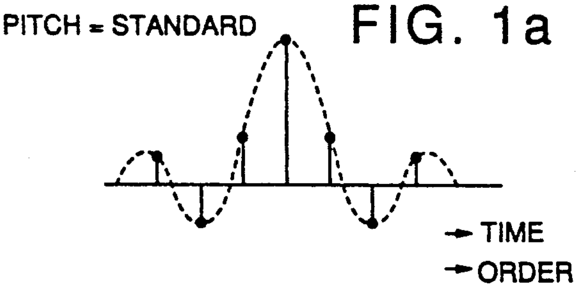
FIGS. 1*a*–1*e* are diagrams exemplifying how an impulse response characteristic changes and is controlled in correspondence with a designated pitch.
Figure 2A:
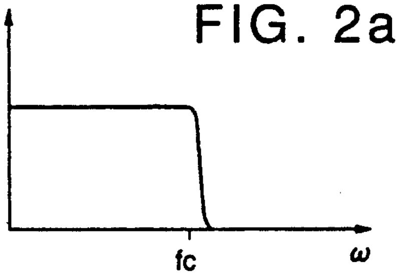
FIGS. 2*a*–2*e* are diagrams showing an example of a filter characteristic corresponding to the impulse response characteristic shown in FIG. 1.
Figure 1B:
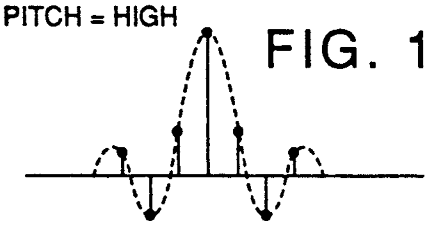
Figure 2B:
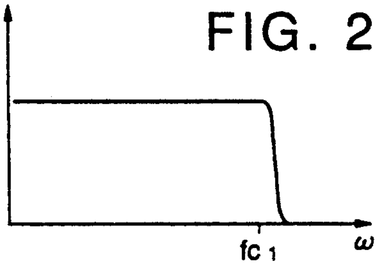
Figure 1C:
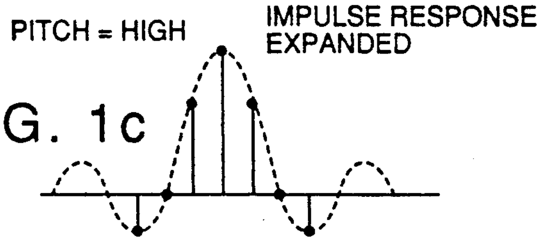
Figure 2C:
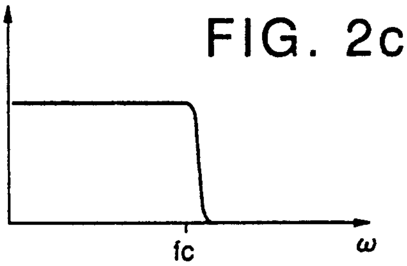
Figure 1D:
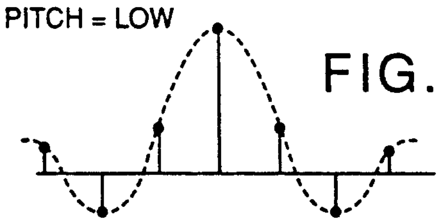
Figure 2D:
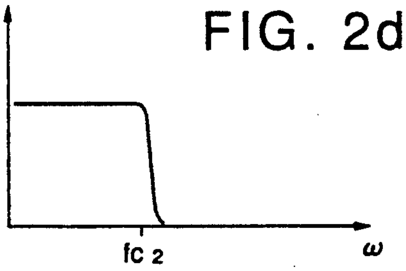
Figure 1E:
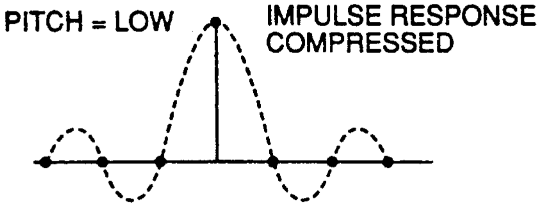
Figure 2E:
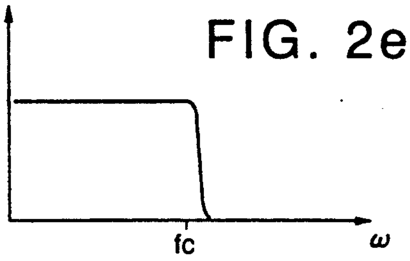
Figure 3:
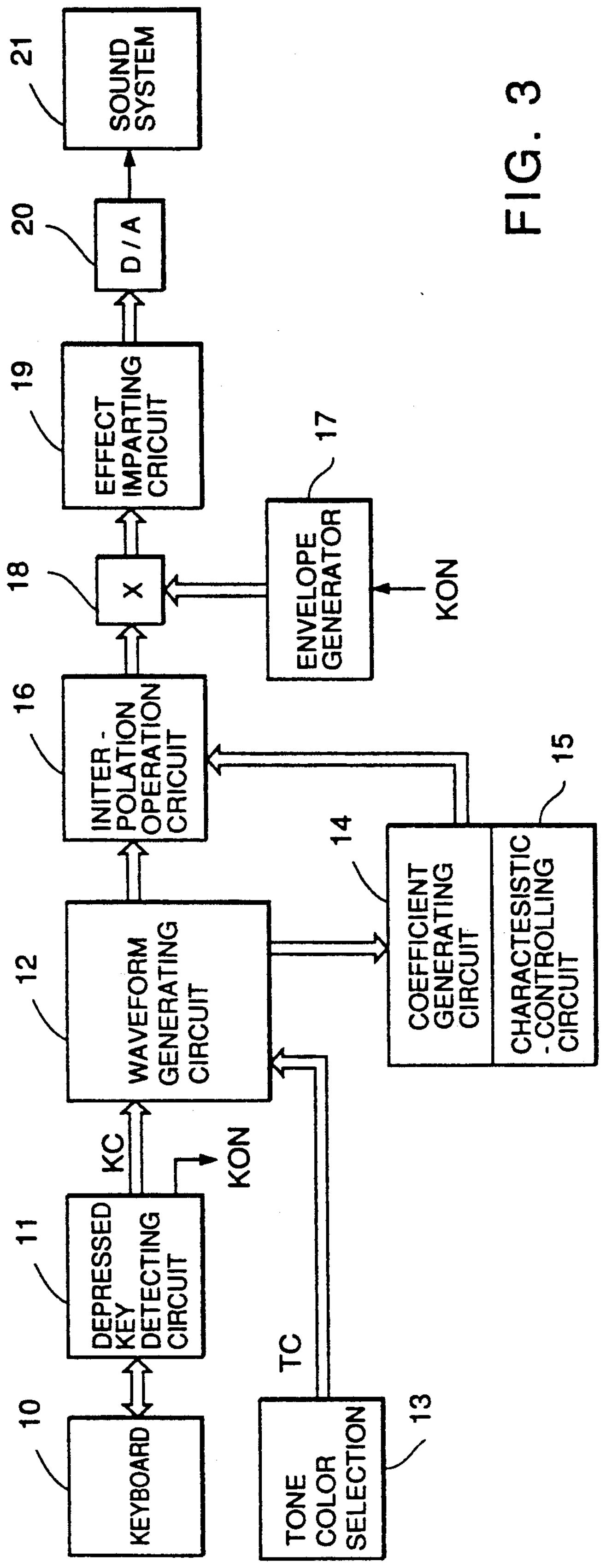
FIG. 3 is a block diagram showing an overall construction of an example electronic musical instrument embodying the present invention.

FIG. 3 is a block diagram showing an overall construction of an example electronic musical instrument which embodies the present invention. A keyboard 10 has a plurality of keys for designating a pitch of a tone to be generated. A depressed key detecting circuit 11 detects a depressed key on the keyboard 10 and outputs a key code KC indicative of the depressed key as well as a key-on signal. A waveform generating circuit 12 generates digital waveform sample data at a frequency that corresponds to the designated pitch, in accordance with a key code KC provided from the depressed key detecting circuit 11. Tone color data TC indicative of a tone color selected by a tone color selecting device 13 is given to the waveform generating circuit 12, so that the waveform generating circuit 12 can generate digital waveform sample data for a tone waveform corresponding to the selected tone color.

A coefficient generating circuit 14 generates n coefficients corresponding to a desired interpolation characteristic. A characteristic-controlling circuit 15, which is provided in conjunction with the coefficient generating circuit 14, performs controls for changing coefficients to be generated from the coefficient generating circuit 14, so that the interpolation characteristic can be variably controlled in response to a designated pitch. An interpolation operation circuit 16 arithmetically operates n digital waveform sample data which are produced sequentially from the waveform generating circuit 12 with n coefficients, respectively, which are produced from the coefficient generating circuit 14. Then, the interpolation operation circuit 16 carries out interpolation operation and synthesize the operation results to produce one sample data.

An envelope generator 17 generates an envelope waveform signal on the basis of a key-on signal from the depressed key detecting circuit 11. A multiplier 18 multiplies tone signal sample data output from the interpolation operation circuit 16 by an envelope waveform signal, to impart a tone volume envelope to a tone signal. Tone signal sample data to which a tone volume envelope has been imparted is also imparted a desired effect such as a reverberation effect by an effect imparting circuit 19, and then the data is converted into an analog signal by a digital-to-analog converter 20 and thence given to a sound system 21.

An example of the waveform generating circuit 12 will now be described with reference to FIG. 4, in which figure the waveform generating circuit 12 is shown as including a waveform memory 22 as a tone source. In the waveform memory 22, different waveforms corresponding to various tone colors are stored. The waveforms may be stored into and read out from the memory in any of the conventionally-known manners; such as in a manner in which a one-cycle waveform is stored and read out repeatedly, or in a manner in which a half-cycle waveform is stored and read out repeatedly in reciprocative fashion or in the forward and reverse directions, or in a manner in which a plural-cycle waveform is stored and read out once or repeatedly, or in a manner in which a plural-cycle waveform of an attack portion is read out once, and then a one-cycle or plural-cycle waveform of a sustained portion is read out repeatedly, or in a manner in which a waveform corresponding to an entire tone generation period from generation start to generation end. Further, data coding technique to be utilized for storing data into the memory 22 is not restricted to PCM (pulse code modulation) but it may be any other desired one such as DPCM (differential pulse code modulation), ADPCM (adaptive differential pulse code modulation), or delta modulation.

In addition to the waveform memory 22, the waveform generating circuit 12 includes circuitry for reading the memory 22. FIG. 4 shows an example of such memory reading circuitry which is suitable for reading the waveform memory 22 where a waveform corresponding to an entire tone generation period is stored for each tone color. For example, such waveform storage may be done by recording tone signals of a predetermined standard pitch from outside, then sampling the recorded tone signals in accordance with a sampling clock pulse of a fixed frequency and thence storing the sampled tone signals into the waveform memory 22. To read out the waveform from the memory at the standard tone pitch, the waveform memory is read in accordance with address signals changing at such a rate that one address increment occurs at each cycle of the sampling clock pulse SMC. To read out the waveform from the memory at a desired tone pitch other than the standard pitch, the change rate of address signals is controlled in accordance with the frequency ratio between the desired pitch and the standard pitch.

Figure 4:
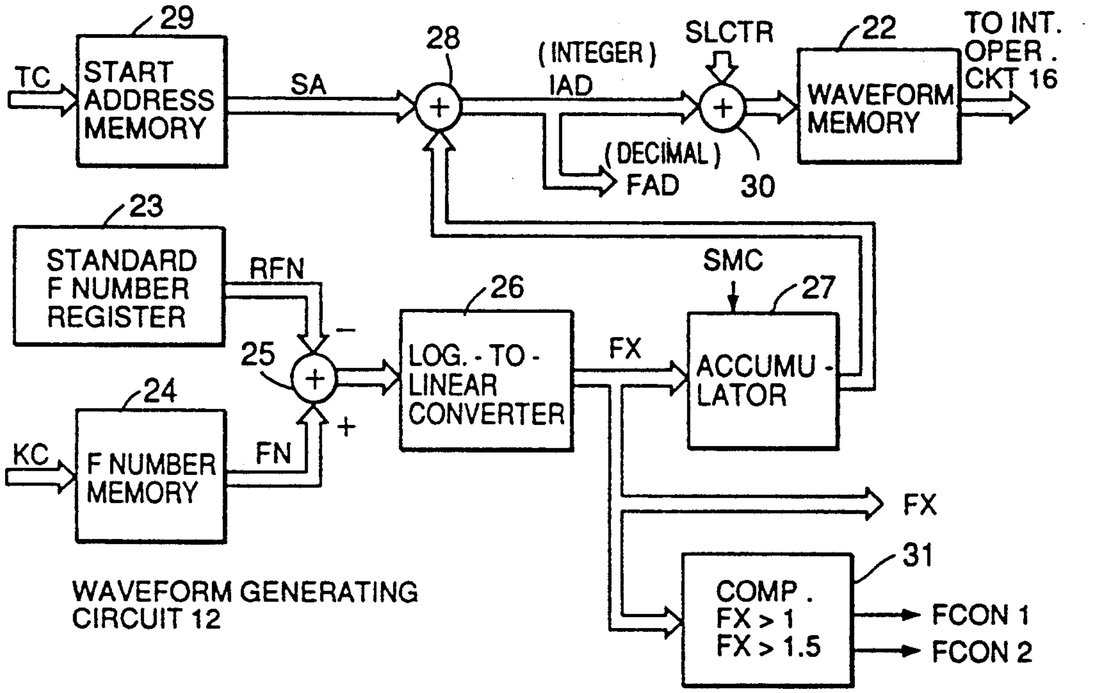
FIG. 4 is a block diagram showing an example of a waveform generating circuit in FIG. 3.

In a standard F number register 23 shown in FIG. 4, a numerical value indicative of the frequency of the standard pitch (standard F number RFN) is stored in logarithmic value, that is, in cent value. In a F number memory 24, numerical values indicative of pitch frequencies corresponding to the individual keys (F numbers) are stored in logarithmic value, that is, in cent value. A F number FN corresponding to the pitch of a depressed key is read out from the F number memory 24 in response to a key code KC provided from the depressed key detecting circuit 11. A subtractor 25 subtracts the standard F number RFN from a F number corresponding to the tone pitch of a depressed key (FN-RFN), to obtain the frequency ratio of the pitch of the depressed key to the standard pitch, because subtraction between logarithmic values is equivalent to division between antilogarithmic values. A logarithmic-to-linear converter 26 converts the output of the subtractor 25 to a linear value to obtain a linear value indicative of the frequency ratio.

The output of this logarithmic-to-linear converter 26 is given to an accumulator 27 as an address increment value FX. This address increment value FX, which is a value containing a decimal part, will be "1" if the depressed key pitch is equivalent to the standard tone pitch, will be greater than "1" if the depressed key pitch is higher than the standard tone pitch, and will be smaller than "1" if the depressed key pitch is lower than the standard pitch.

The accumulator 27 repeatedly accumulates input address increment values FX at a frequency in accordance with the sampling clock pulse SMC and it serves as an address counter. The accumulator 27 is reset at the start of tone generation, to initiate accumulating address increment values FX from the value of 0. The output of the accumulator 27 is a relative address signal to be used for reading out waveform sample data from the waveform memory 22, and it is added with start address data SA in an adder 28 to become an address signal that indicates an absolute address in the waveform memory 22.

A start address memory 29 stores therein start addresses of the individual waveforms corresponding to various tone colors stored in the waveform memory 22. A predetermined start address is read out from the start address memory 29, in correspondence with tone color data indicative of a selected tone color and other tone color parameters (for example, key scaling parameters and touch data). This start address data SA is given to the adder 28 in which the data SA is added with the relative address signal output from the accumulator 27, mentioned earlier.

The address signal that is output from the adder 28 comprises an integer part IAD and a decimal part FAD, and data of the integer part IAD is given via an adder 30 to an address input of the waveform memory 22.

Figure 5:
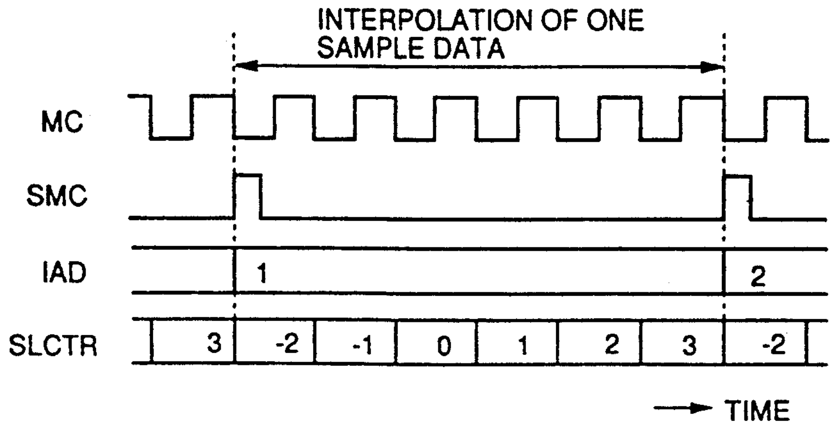
FIG. 5 is a time chart showing examples of various clock pulses and time-divisional operation timings.

The value of the integer part IAD specifies an address of a certain digital waveform sample data. The adder 30 adds an address offset value SLCTR to the integer part IAD, so as to produce n addresses for reading out n digital waveform sample data that will be used for interpolation operation. It is now assumed that $n=6$, in which case, as shown in FIG. 5, one period time of the sampling clock pulse SMC is divided into six subperiods by a master clock pulse MC having a frequency six times as high as that of the sampling clock pulse SMC, and numerical values, $-2$, $-1$, 0, 1, 2, 3 are time-divisionally provided as address offset values SLCTR in response to respective time slots. The timing of the integer part IAD corresponds to one cycle of the sampling clock pulse SMC, and thus the adder 30 outputs six address values $IAD-2$, $IAD-1$, IAD, $IAD+1$, $IAD+2$, $IAD+3$ for respective time slots. In response to this, $n=6$ waveform sample data corresponding respectively to the address values $IAD-2$, $IAD-1$, IAD, $IAD+1$, $IAD+2$, $IAD+3$ are time-divisionally read out from the waveform memory 22 within one sampling cycle (that is, one SMC cycle).

The comparator 31 compares the address increment value FX with numerical values of "1" and "1.5", and it provides "1" as an output signal FCON1 if $FX>1$ and provides "1" as an output signal cone if $FX>1.5$.

Next, specific examples of the coefficient generating circuit 14, characteristic-controlling circuit 15 and interpolation operation circuit 16 will be described with reference to FIG. 6.

Figure 6:
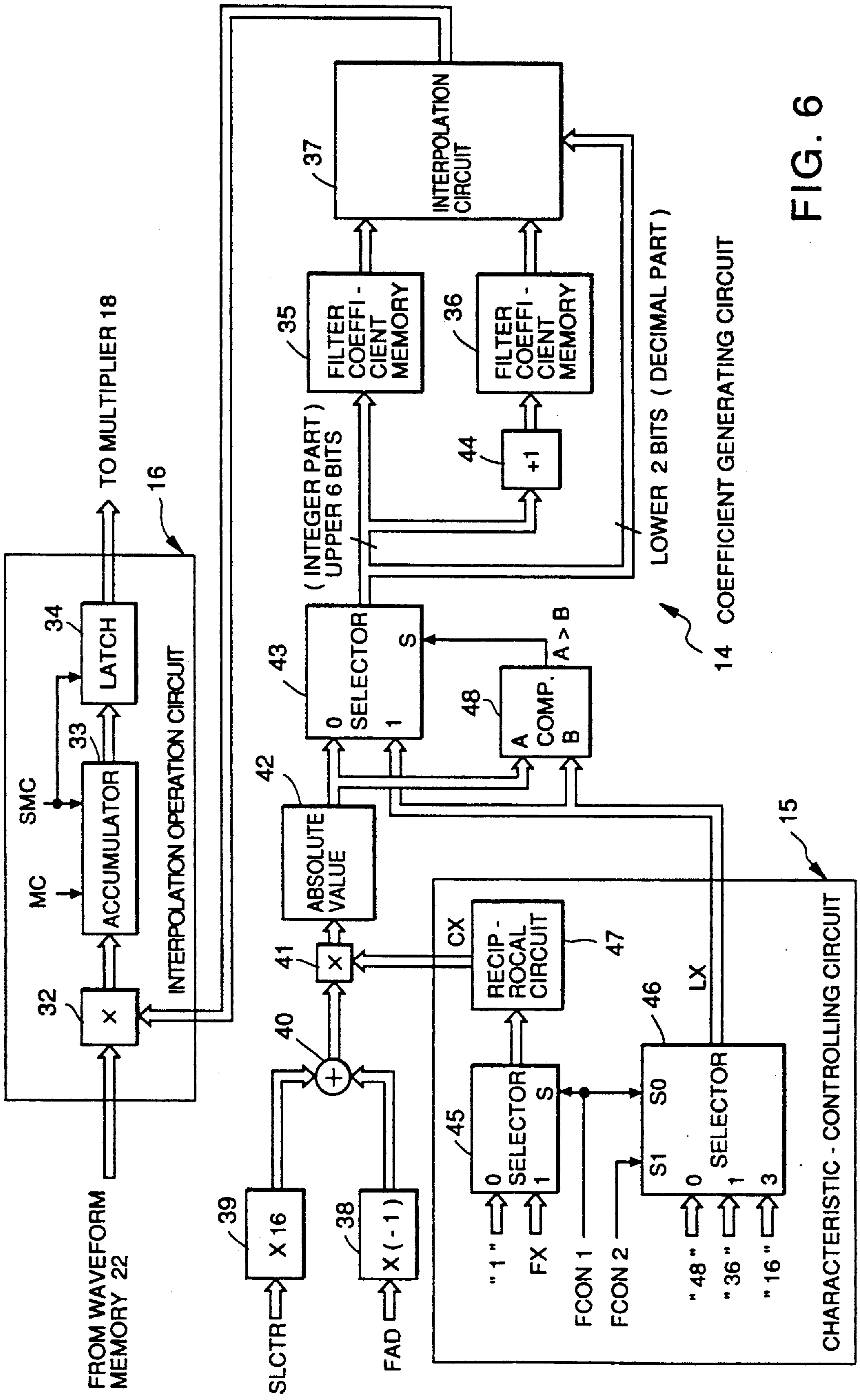
FIG. 6 is a block diagram showing examples of an interpolation operation circuit, coefficient generating circuit and characteristic-controlling circuit in FIG. 3.

Referring to the interpolation operation circuit 16 shown in FIG. 6, digital waveform sample data read out from the waveform memory 22 is input to a multiplier 32 that is provided for coefficient multiplication. Interpolation coefficients are supplied from the coefficient generating circuit 14 in correspondence with the decimal part FAD of the address signal, as will be described later. The outputs of the multiplier 32 are input to an accumulator 33 by which a convolution sum is obtained. The accumulator 33 carries out accumulation at the timing of the master clock pulse MC (that is, at each step of the address offset value SLCTR), and the accumulator 33 is reset at the timing of the sampling clock pulse SMC. Right before the accumulated valve is cleared in the accumulator 33, the convolution sum which has been obtained through the current operation is latched into a latch circuit 34.

The coefficient generating circuit 14 includes filter coefficient memories 35, 36 in each of which filter coefficients of $m=97$ orders (0th to 96th orders), circuitry for selecting and reading out $n=6$ filter coefficients from among the 97-order filter coefficients in accordance with the value of the decimal part FAD, and an interpolation circuit 37 for implementing interpolation of the coefficients read out from the memories 35, 36.

Figure 7:
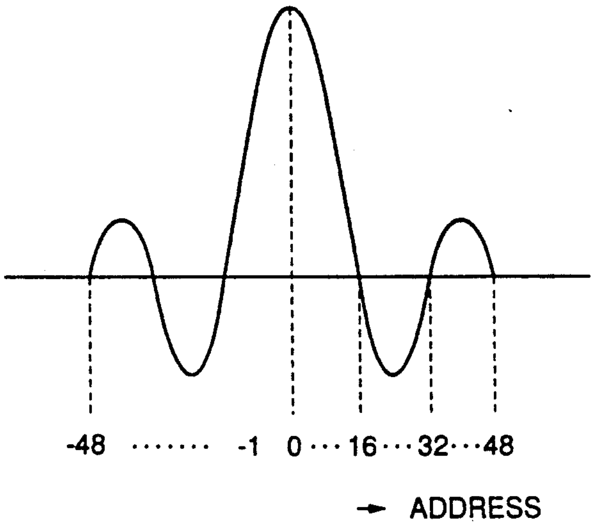
FIG. 7 is a diagram showing an example of an impulse response characteristic of coefficients stored in filter coefficient memories in FIG. 7.

The two filter coefficients memories 35, 36, whose contents are identical to each other, are provided so that two adjacent filter coefficients can be read out in parallel therefrom to be used for interpolation in the interpolation circuit 37. The filter coefficients stored in each of the filter coefficient memories 35, 36 exhibit an impulse response such as shown in FIG. 7, and a filter characteristic realized by this impulse response is a low-pass filter characteristic such as shown in (a) of FIG. 2 whose cut-off frequency fc is established at a predetermined frequency lower than a half of the sampling frequency.

The filter coefficients of 0th to 96th orders are distributed in such manner that 0th to 47th orders and 49th to 96th are symmetrical with each other with 48th order in-between. In view of such filter coefficient distribution, only the filter coefficients of 48th to 96th orders are stored at addresses 1–48 in the filter coefficient memories 25, 36. The filter coefficients of 0th to 47th orders can be obtained by reading in the opposite direction the addresses 1–48 that store the filter coefficients of 49th to 96th orders. To this end, addresses $-48$ to $-1$ are allocated to the filter coefficients of 0th to 47th orders, and when accessing the memories 35, 36, the negative signs of the addresses −48 to −1 are removed by an absolute value circuit 42 so that the memories 35, 36 can be accessed by absolute values 48–1.

In accordance with the value of the decimal part FAD as well as the address offset value SLCTR, multipliers 38, 39 and an adder 40 produce an order address signal for reading out a coefficient in correspondence with respective integer sections IAD−2, IAD−1, IAD, IAD+1, IAD+2, IAD+3 for n=6 samples. 6 bit data of the decimal part FAD of the address signal is input to the multiplier 38 to be multiplied by "−1". The address offset value SLCTR is input to the multiplier 39 which then carries out a multiplication of "16×SLCTR". The outputs of the multipliers 38, 39 are added together in the adder 40. The output of the adder 40, namely, the order address signal for reading out a filter coefficient is determined in the following manner.

TABLE 1

| SLCTR | Integer Part of 6 Sampling Points | Output of Adder 40 (Order Address) |
|---|---|---|
| −2 | IAD −2 | −32-FAD |
| −1 | IAD −1 | −16-FAD |
| 0 | IAD | -FAD |
| 1 | IAD +1 | 16-FAD |
| 2 | IAD +2 | 32-FAD |
| 3 | IAD +3 | 48-FAD |

The multiplier 38 treats upper 4 bits of 6 bit data of the decimal part FAD as an integer part and lower 2 bits as a decimal part, and it outputs such data to the adder 40. For example, when the upper 4 bit integer part takes the maximum value of 16, the order address which is output from the adder 40 in correspondence with SLCTR=−2 will be −48. Thus, the order address output from the adder 40 will take a value within a range from −48 to 48, to which value will be added the lower 2 bit decimal part.

The output of the adder 40 is given via a multiplier 41 to the absolute value circuit 42. The multiplier 41 functions to change the order address in accordance with a characteristic-control signal CX provided by the characteristic-controlling circuit 15. When it is not desired to change the order address, the characteristic-control signal of "1" is provided, so that the output of the adder 40 is output to the absolute value circuit 42 without being changed by the adder 41. When the order address is one of negative values ranging from −48 to −1, the absolute value circuit 42 changes the order address to one of the values, 48 to 1 by removing its negative sign.

Upper 6 bits of the output from the absolute value circuit 42 are indicative of an order address 0–48, and lower 2 bits are indicative of a decimal part. The output of the absolute value circuit 42 is applied to an input 0 of a selector 43. A selection control signal to be applied to a selection control input S is normally "0", so that the selector 43 selects and outputs data at the input 0. Of the output of the absolute value circuit 42 that is selectively output via the selector 43, the upper 6 bits indicative of an order address 0–48 are input to the filter coefficient memory 35, and they are also input to the filter coefficient memory 36 after having been added with 1 in an adder 44.

Then, two coefficient data of adjacent order addresses are read out from the filter coefficient memories 35, 36. The two coefficient data are input to the interpolation circuit 37. On the other hand, the lower 2 bits of the output from the selector 43, that is, the decimal part data is input to the interpolation circuit 37. In response to this, the above-mentioned two adjacent coefficient data are interpolated with a four-step interpolation characteristic (for example, a linear interpolation characteristic). In this manner, although only filter coefficients of m=97 orders are actually stored in the memories 35, 36, the interpolation can provide substantially equivalent results to those obtained in the case where filter coefficients of 4×97=388 are densely stored in the memories. The output of the interpolation circuit 37 is input as interpolation coefficient data to the multiplier 32 of the interpolation operation circuit 16. It is a matter of course that the interpolation of the coefficient (hence, the interpolation circuit 37, and its related adder 44 and memory 36) is not necessarily essential to the invention or may be omitted.

In the above-described manner, the coefficient generating circuit 14 produces interpolation coefficient data in response to respective time-divisional timings of 6 address offset values as shown in FIG. 5. The multiplier 32 multiplies n=6 digital waveform sample data generated in response to the respective time-divisional timings of 6 address offset values, by the corresponding n=6 interpolating coefficient data, respectively. As mentioned earlier, the outputs of this multiplier 32 are additively synthesized into one digital waveform sample data which is then latched into the latch 34. In this manner, waveform interpolation is carried out, and at the same time a filtering process is also carried out in accordance with the impulse response characteristic of the then-used interpolation coefficient. In this embodiment, low-pass filtering process is carried out, with the cut-off frequency being set to be lower than a half of the sampling frequency at the standard pitch, so that an aliasing noise can be eliminated as intended.

From the viewpoint of filtering process, only n=6 coefficients are selectively used out of coefficients constituting an impulse response characteristic of 97 orders (388 orders if coefficient interpolation is also considered), but this does not change or affect a desired filter characteristic in any way. Further, in this embodiment, a multiplication of "16×SLCTR" is done in the multiplier 39, so that the order intervals between n=6 coefficients are made 16 orders and coefficients of 97 orders are selectively used at an interval of 16 orders. This is equivalent to the case where each unused intermediate coefficient is multiplied by sample value data of 0, and thus a filter operation according to the impulse response characteristic of 97 orders (388 orders if coefficient interpolation is also considered) is substantially carried out. If the number of orders of a desired impulse response is m (m=97 in this embodiment), m is set to be larger than n (m>n) according to this embodiment; however, the relationship may of course be m=n.

Now, description will be made on the characteristic-controlling circuit 15. The address increment value data FX and the control signals FCON1 and FCON2 output from the circuit shown in FIG. 4 are input to this characteristic-controlling circuit 15, that is, the address increment value data FX is applied to an input 1 of a selector 45, while the control signal FCON1 is applied to a selection control input S of the selector 45. Also, the control signals FCON1 and FCON2 are applied to selection control inputs S0, S1 of the selector 46. When a numerical value of "1" is given to an input 0 of the selector 45 and the control signals FCON1 applied to the selection control signal S is 0, that is, when the address increment value data FX is equivalent to or smaller than 1, the value of "1" is selected; on the other hand, when the control signals FCON1 is 1, that is, when the address increment value data FX is greater than 1, the address increment value data FX itself is selected. The output of the selector 45 is applied to a reciprocal circuit 47 which in turn obtains a reciprocal of the output. The output of the reciprocal circuit 47 is given as a characteristic control signal CX to the multiplier 40.

Consequently, when $FX \leqq 1$, that is, when the designated pitch is equivalent to or lower than the standard pitch, the numerical value of "1" is output as the characteristic control signal CX. In this case, the output of the adder 40 is given via the multiplier 41 to the absolute value circuit 42 without being changed in the multiplier 41, as mentioned earlier. Accordingly, addresses for reading the filter coefficient memories 35, 36 are not changed, and so a low-pass filter control in accordance with an impulse response characteristic as stored in the memories 35, 36 is performed in the interpolation operation circuit 16. If the designated pitch is the same as the standard pitch in this case, the cut-off frequency fc, as shown in part (a) of FIG. 2, is still a predetermined cut-off frequency that is lower than a half of the sampling frequency, and so an aliasing noise can be eliminated. If, on the other hand, the designated pitch is lower than the standard pitch, the effective sampling intervals get broader, and thus the impulse response is, as shown in part (a) of FIG. 1, virtually expanded in the time axis direction, in accordance with which a resultant filter characteristic is caused to change as exemplified in part (d) of FIG. 2 and the cut-off frequency gets lower. But, since lowering of the cut-off frequency does not adversely affect the elimination of an aliasing noise, no particular adjustment is made in this embodiment in spite of the substantial change in the filter characteristic.

When $FX > 1$, that is, when the designated pitch is higher than the standard pitch, the reciprocal 1/FX of the value FX is output as a characteristic control signal CX. In this case, the reciprocal 1/FX is a value smaller than 1 and is inversely proportional to FX, so that 1/Fx decreases as FX increases. Because $1/FX = CX$ smaller than 1 is input to the multiplier 41, the order address given from the adder 40 is changed in a direction in which it gets smaller at a rate corresponding to the CX. Thus, the reading addresses of the filter coefficient memories 35, 36 are changed in a direction in which they get smaller. As the result, the impulse response characteristic set in each of the memories 35, 36 is apparently expanded in the time axis direction. Namely, intervals between addresses of the respective coefficients read out from the coefficient memories get shorter without the corresponding offset values SLCTR (−2, −1, 0, 1, 2, 3) being changed (without change in time intervals between sample data). Thus, times corresponding to the address intervals between the coefficients per se do not change even though the address intervals have got shorter, so that an impulse response characteristic apparently expanded in the time axis direction as compared with the impulse response characteristic set in each of the coefficient memories can be obtained by reading the coefficient memories in accordance with the order addresses which have been changed in a direction in which they get smaller. Of course, in this case, interpolation coefficient values corresponding to the respective ones of $n = 6$ waveform sample data are changed in correspondence with the values of FX, and the interpolation is resultantly changed.

In this manner, waveform interpolation operation and low-pass filter control are carried out in the interpolation operation circuit 16, in accordance with the impulse response characteristic expanded in the time axis direction. In this case, because the designated pitch is higher than the standard pitch, the effective sampling intervals become narrower in the event that the above-mentioned characteristic changing control has not been done (namely, the condition, of $CX = 1$ has not been changed), in which case the impulse response is virtually compressed in the time axis direction in such a manner as shown in part (b) of FIG. 1. In response to this, the resultant low-pass filter characteristic changes in such a manner as shown in part (b) of FIG. 2, and so the cut-off frequency fc1 becomes higher. But, in this embodiment, because arrangements are made such that the condition of $CX = 1/FX$ is met and the values of the coefficients corresponding to individual sampling points are changed so as to expand the impulse response characteristic in the time axis direction in correspondence with the difference or ratio (FX), the virtual impulse response obtained as a result of the interpolation operation becomes the one as shown in part (c) of FIG. 1 which is equivalent to the one as shown in part (a) of FIG. 1. Accordingly, the resultant low-pass filter characteristic can be the one as shown in (c) of FIG. 2 whose cut-off frequency fc does not shift. As the result, an aliasing noise can be eliminated even in the case where a tone of a pitch higher than the standard pitch is generated.

Next, limiting functions will be described.

When the order addresses are changed to expand the impulse response characteristic in the time axis direction in the above described manner, for example, the maximum address of "48" is also changed to be a smaller value, so that the impulse response set in the coefficient memories can not made full use of any longer, and the use of the impulse response is inevitably limited at a halfway position. As the result, continuousness of the impulse response can not be maintained to the extent that a noise problem may arise. To solve this problem, it is preferable to add limiting functions for discarding some coefficients of marginal or higher orders. For example, if such discard is made at a zero-cross point along the impulse response characteristic curve, continuousness of the impulse response can be improved to the extent that a natural continuousness of the impulse response is generally ensured. So, the limiting functions may preferably be provided for discard at such point.

In the case of an impulse response characteristic as shown in FIG. 7, order addresses 16, 32, 48 are at zero-cross points and hence are designated as discard points. To this end, in the characteristic-controlling circuit 15 shown in FIG. 6, numerical values of "48", "32" and "16" are input to data inputs 0, 1 and 3, respectively so that the numerical value of "48" at the data input 0 is selectively output from the selector 46 when the control signals FCON1, FCON2 applied to the selection control inputs are both "0" (namely, when $FX \leqq 1$), the numerical value of "32" at the data input 1 is selectively output when the control signals FCON1, FCON2 are "1" and "0", respectively (namely, when $1.5 \geqq FX > 1$), and the numerical value of "16" at the data input 3 is selectively output when the control signals FCON1, FCON2 are both "1" (namely, when $FX > 1.5$).

The output of the selector 46 is applied as a limit order address LX to input 1 of the selector 43 and also to an input B of a comparator 48. To an input A of the comparator 48 is applied order address data that is output from the absolute value circuit 42. The comparator 48 outputs "1" as a comparison output signal when A>B; under other conditions it outputs "0". In other words, when the order address data output from the absolute value circuit 42 does not exceed the limit order address LX, "0" is output from the selector 48, so that the selector 43 directly outputs the order address data as output from the absolute value circuit 42; on the other hand, when the order address data output from the absolute value circuit 42 exceeds the limit order address LX, "1" is output from the selector 48, so that the selector 43 discards the order address data output from the absolute value circuit 42 and instead outputs the limit order address LX.

The reason why the limit order address LX is made "32" when 1.5≧FX>1 is that the original maximum address value of 48 is changed within a range of 48 to 32 depending on the value of 1/FX by a multiplication of CX=1/FX in the multiplier 41 and also an address of "32" is selected as a zero-cross point to cover.

Further, the reason why the limit order address LX is made "16" when FX>1.5 is that the original maximum address value of 48 is changed to one of the values below 32 depending on the value of 1/FX by a multiplication of CX=1/FX in the multiplier 41 and also an address of "16" is selected as a zero-cross point to make up for the change of the maximum address.

Now, an example modification of the circuit construction for realizing the said limiting functions will be described with reference to FIG. 8.

Figure 8:
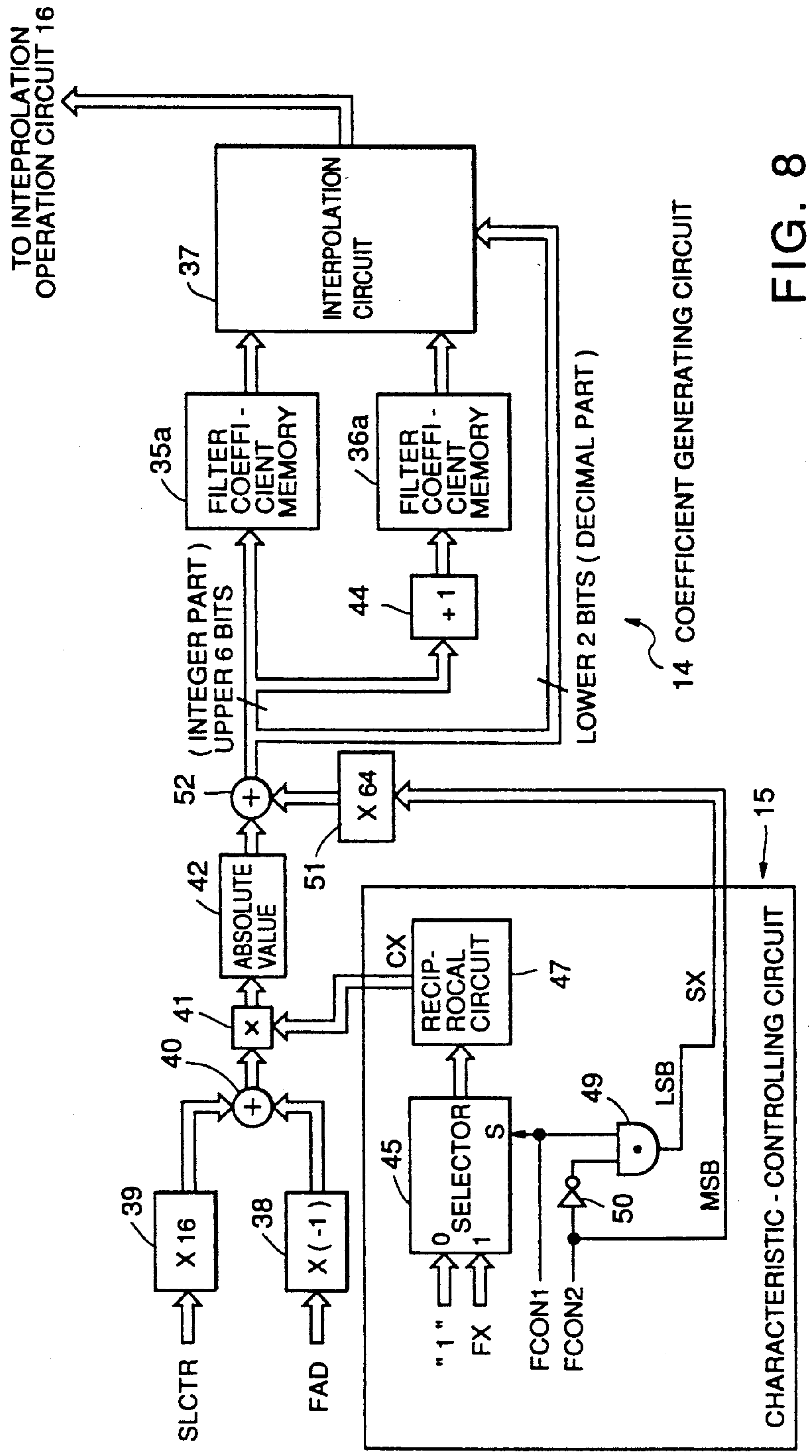
FIG. 8 is a block diagram showing another examples of the coefficient generating circuit and characteristic-controlling circuit in FIG. 3.

In the example shown in FIG. 8, filter coefficient memories 35*a*, 36*a* are slightly different in memory contents from the filter coefficient memories 35*a*, 36*a* shown in FIG. 6. More specifically, as shown in parts (a), (b) and (c) of FIG. 9, these filter coefficient memories 35*a*, 36*a* store impulse response characteristic coefficients separately for each of different limiting points so that the impulse response characteristic coefficients for any of the limiting points may be selectively read out therefrom. Namely, as shown in part (a) of FIG. 9, impulse response characteristic coefficients similar to those in FIG. 7 are stored at an address range of 0 to 48. Also, as shown in part (b) of FIG. 9, impulse response characteristic coefficients similar to those at addresses 0–32 of FIG. 7 are stored at an address range of 64 to 96. In this case, a coefficient of 0 is stored at an address range of 97 to 112, this being the same as the case where "32" is selected as a limit order address LX. Further, as shown in part (c) of FIG. 9, impulse response characteristic coefficients at addresses 0–16 of FIG. 7 are stored at an address range of 128 to 144. In this case, a coefficient of 0 is stored at an address range of 145 to 176, this being the same as the case where "16" is selected as a limit order address LX.

Also, according to this modification, in the characteristic-controlling circuit 15, the selector 46 is replaced by an AND gate 49 and an inverter 50. To the AND gate 49 are input the control signal FCON1 and a signal produced by inverting the control signal FCON2 in the inverter 50. Then, 2 bit address control data SX whose lower bit is the output of the AND gate 49 and whose upper bit is the control signal FCON2 is produced. This address control data SX is input to a 64-multiplying circuit 51 in which the data SX is multiplied by 64. An adder 52 is provided in place of the selector 43 of FIG. 6, to add the output data of the 64-multiplying circuit 51 to the order address data output from the absolute value circuit 42. The output data of the 64-multiplying circuit 51 serves as an address offset value.

Figures 9A, 9B, 9C:
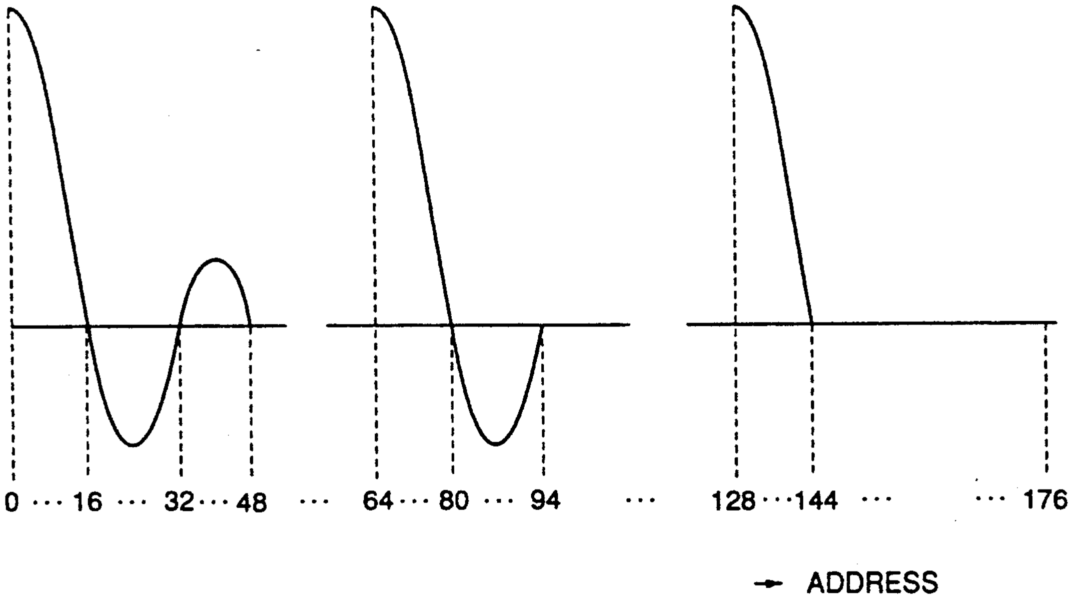
FIG. 9 is a diagram showing an example memory contents of a filter coefficient memory in FIG. 8.

When the control signals FCON1, FCON2 are both "0" (namely, when FX≦1), the value of the address control data SX is "0" and hence the 64-multiplying circuit 51 outputs "0", so that the order address data from the absolute value circuit 42 is directly output from the adder 52. Consequently, no address offsetting takes place, and the impulse response characteristic coefficients stored at the address range of 0 to 48 as shown in part (a) of FIG. 9 are read out from the filter coefficient memories 35*a*, 36*a*.

When the control signals FCON1, FCON2 are "1" and "0", respectively (namely, when 1.5≧FX>1), the value of the address control data SX is "0" and hence the 64-multiplying circuit 51 outputs "64", so that the order address data from the absolute value circuit 42 is output from the adder 52 after having been added with "64". Consequently, the coefficient memory reading address is offset by 64 addresses, and the impulse response characteristic coefficients stored at the address range of 64 to 112 as shown in part (b) of FIG. 9 are read out from the filter coefficient memories 35*a*, 36*a*. It is to be noted that a predetermined limiting function is obtained here because limiting is done at the address 96.

Further, when the control signals FCON1, FCON2 are both "1" (namely, when FX>1.5), the value of the address control data SX is "2" and hence the 64-multiplying circuit 51 outputs "128", so that the order address data from the absolute value circuit 42 is output from the adder 52 after having been added with "128". Consequently, the coefficient memory reading address is offset by 128 addresses, and the impulse response characteristic coefficients stored at the address range of 128 to 176 as shown in part (c) of FIG. 9 are read out from the filter coefficient memories 35*a*, 36*a*. It is to be noted that a predetermined limiting function is obtained here because limiting is done at the address 144.

Although a single tone generation type device has been described in the above embodiments, it is a matter of course that the invention can also be applied to other type devices which are capable of generating plural tones in plural channels in time divisional or parallel manner.

Although a filter characteristic obtained as a result of waveform interpolation operation is set to be a low-pass filter characteristic in the above embodiments, the invention is of course not limited to this, and any desired filter characteristic may be utilized depending on the manner in which coefficients are set.

Further, when a tone of a pitch higher than the standard pitch is to be generated in the above embodiments, interpolation coefficients are variably controlled to control an interpolation characteristic and also a resultant filter characteristic. But, this invention is not limited to this, and an interpolation characteristic and a resultant filter characteristic may be controlled even when a tone of a pitch lower than the standard pitch is to be generated. In such case, the impulse response characteristic is expanded in the time axis direction when a pitch designated for generating a tone is higher than the standard pitch, while the impulse response characteristic is compressed in the time axis direction when a pitch designated for generating a tone is lower than the standard pitch. Thus, the waveform interpolation characteristic can be variably controlled with respect to all the pitches or tone ranges. Such control is effective particularly when a filter characteristic is used for tone color controls.

Further, rather than always performing variable control of coefficients with respect to any pitches, such variable control of coefficients may be performed only in response to a desired specific range of pitches. In this manner, a waveform interpolation characteristic and hence a filter characteristic can be controlled with respect to a specific tone range.

Of course, the idea of dividing pitches into groups of a certain number of pitches, and variably controlling interpolation coefficients for each pitch group so as to control a waveform interpolation characteristic and a resultant filter characteristic is also within the scope of "control corresponding to a designated pitch".

As described so far, according to the present invention, coefficients for determining a waveform interpolation characteristic are variably controlled when generating a tone signal of a smooth waveform by waveform interpolation utilizing digital filter operation. With this arrangement, a resultant filter characteristic can be controlled, and a waveform interpolation circuit can be caused to work also as an effective digital filter, so that functions of both a waveform interpolation and a controllable digital filter can be realized simultaneously. Accordingly, various advantageous results can be expected. For example, when function as a low-pass filter for eliminating an aliasing noise is used, the filter characteristic is prevented from shifting in response to a designated pitch. So, there can be achieved superior advantageous results that an aliasing noise can be reliably eliminated at any designated pitch.

What is claimed is:

1. A tone signal generating device which comprises:
pitch designating means for designating a pitch of a tone to be generated;
waveform generating means for generating digital waveform sample data to provide a waveform having a frequency corresponding to the pitch designated by the pitch designating means;
waveform interpolation coefficient generating means for generating plural waveform interpolation coefficients to be used for interpolating between values of the digital waveform sample data;
characteristic-controlling means for controlling the waveform interpolation coefficient generating means so as to vary the values of waveform interpolation coefficients generated by said coefficient generating means in correspondence with the pitch designated by the pitch designating means so as to variably control an interpolation characteristic; and
interpolation operation means for performing an operation between the coefficients and plural digital waveform sample data generated sequentially from the waveform generating means to provide interpolated waveform sample data as a tone signal having a characteristic controlled in accordance with said interpolation characteristic.

2. A tone signal generating device as defined in claim 1, wherein said coefficient generating means generates said coefficients in correspondence with a desired impulse response characteristic, and said characteristic-controlling means controls the coefficient generating means to change values of the individual coefficients to compress or expand the impulse response characteristic in a time axis direction in correspondence with a designated pitch.

3. A tone signal generating device as defined in claim 2, wherein said characteristic-controlling means controls the coefficient generating means to control the values of the individual coefficients so as to compress or expand the impulse response characteristic in the time axis direction in correspondence with a difference between a predetermined standard pitch and the designated pitch in such manner that the impulse response characteristic is expanded when the designated pitch is higher than the standard pitch and compressed when the designated pitch is lower than the standard pitch, so that a desired filter characteristic is obtained as a result of variably controlling the interpolation characteristic.

4. A tone signal generating device as defined in claim 2, wherein said desired impulse response characteristic is a characteristic corresponding to a low-pass filter, and said characteristic-controlling means causes the coefficient generating means to control the values of the individual coefficients so as to expand the impulse response characteristic in the time axis direction in correspondence with the difference between a predetermined standard pitch and the designated pitch, when a pitch higher than the standard pitch has been designated by the pitch designating means.

5. A tone signal generating device as defined in claim 1, wherein when a pitch within a specific range has been designated, said characteristic-controlling means causes the coefficient generating means to vary the values of the individual coefficients to be generated by the coefficient generating means, so as to variably control the interpolation characteristic in correspondence with the designated pitch.

6. A tone signal generating device as defined in claim 1, wherein:
said waveform generating means includes means for generating waveform sample address signals composed of an integer part and a decimal part that change in value at a rate corresponding to the designated pitch and means for generating digital waveform sample data in correspondence with the integer part of said waveform sample address signals, and
said waveform interpolation coefficient generating means includes coefficient storing means for storing interpolation coefficients of m orders and coefficient selection means for selecting and reading n coefficients out of said coefficient storing means, wherein such selection is made on the basis of the value of the decimal part of the waveform sample address signal, where m is greater than n.

7. A tone signal generating device as defined in claim 2, wherein when controlling generation of the individual coefficients to compress or expand the impulse response characteristic in the time axis direction, said characteristic-controlling means discards particular coefficients, so as to maintain a natural continuity of the impulse response characteristic.

8. A tone generating device comprising:
sample generating means for generating original sequential samples of a tone waveform at first intervals;
interpolating means for producing interpolated sequential samples, using an interpolation operation based on said original samples, at second intervals different from said first intervals, by calculation of said original samples with interpolation coefficients;

coefficient generating means for generating said interpolation coefficients whose values correspond to the value of said second interval such that the interpolation means also performs a filtering operation to eliminate sampling noise contained in said original samples regardless of the value of the second interval.

* * * * *